US008468430B2

(12) United States Patent
Shin et al.

(10) Patent No.: US 8,468,430 B2
(45) Date of Patent: Jun. 18, 2013

(54) PRODUCT CODE DECODING METHOD AND DEVICE

(75) Inventors: Beomkyu Shin, Seoul (KR); Hosung Park, Seoul (KR); Seokbeom Hong, Seoul (KR); Jong-Seon No, Seoul (KR); Dong-Joon Shin, Seoul (KR)

(73) Assignee: SNU R&DB Foundation, Seoul (KR)

( * ) Notice: Subject to any disclaimer, the term of this patent is extended or adjusted under 35 U.S.C. 154(b) by 279 days.

(21) Appl. No.: 13/005,294

(22) Filed: Jan. 12, 2011

(65) Prior Publication Data

US 2012/0060071 A1    Mar. 8, 2012

(30) Foreign Application Priority Data

Sep. 3, 2010    (KR) .................. 10-2010-0086494

(51) Int. Cl.
*H03M 13/00*    (2006.01)
(52) U.S. Cl.
USPC ........... 714/780; 714/755; 714/794; 714/795; 714/796
(58) Field of Classification Search
USPC ................. 714/755, 780, 794–796
See application file for complete search history.

(56) References Cited

U.S. PATENT DOCUMENTS

| 7,069,496 B2 * | 6/2006 | Fujita et al. ................ 714/780 |
| 7,093,188 B2 * | 8/2006 | Maiuzzo et al. ............ 714/795 |
| 7,310,767 B2 * | 12/2007 | Desai et al. ................ 714/782 |
| 7,446,316 B2 * | 11/2008 | Kilgore et al. ........... 250/339.11 |
| 7,519,898 B2 * | 4/2009 | Narayanan et al. .......... 714/801 |

FOREIGN PATENT DOCUMENTS

| KR | 10-2005-0115588 A | 12/2005 |
| KR | 10 2008 0076613 A | 8/2008 |
| KR | 10-2008-0076613 A | 8/2008 |

OTHER PUBLICATIONS

Shin, B., *Fast and Reliable Decoding Schemes for the LDPC Codes*, Dissertation, Seoul National Univeristy, (Jun. 2010), 113 pages.

* cited by examiner

*Primary Examiner* — Esaw Abraham
(74) *Attorney, Agent, or Firm* — Alston & Bird LLP (57) ABSTRACT

A method for a decoding device to decode a codeword matrix of a product code includes: generating a first extended parity check matrix for a vertical code; decoding a horizontal codeword of a plurality of rows in the codeword matrix to thus perform a first decoding process; generating a second extended parity check matrix by removing a column corresponding to a row of the first decoding-succeeded horizontal codeword from the first extended parity check matrix; and decoding the first decoding-failed horizontal codeword by using the second extended parity check matrix to thus perform a second decoding process. Therefore, the simple and reliable product code decoding method is provided.

13 Claims, 8 Drawing Sheets

PRODUCT CODE DECODING METHOD AND DEVICE

CROSS-REFERENCE TO RELATED APPLICATION

This application claims priority to and the benefit of Korean Patent Application No. 10-2010-0086494 filed in the Korean Intellectual Property Office on Sep. 3, 2010, the entire contents of which are incorporated herein by reference.

BACKGROUND OF THE INVENTION (a) Field of the Invention

The present invention relates to a method and device for decoding a product code.

(b) Description of the Related Art

Recently, very low bit error rates (BER) have been required for radio communication or storage devices without feedback channels so as to provide reliability to information transmission or storage. A turbo code or low-density parity-check (LDPC) code is used to correct errors, but it is difficult to achieve very low BERs required for the radio communication or storage devices without feedback channels by only using the code.

Accordingly, a decoding method using a product code has been proposed. The product code includes a horizontal code and a vertical code, and the decoding method using a product code sequentially decodes the horizontal code and the vertical code of the product code.

Further, in order to increase decoding performance, the maximum likelihood (ML) decoding scheme using soft decision information for the horizontal code and the vertical code of the product code has been proposed. However, the ML decoding process of the product code is complicated, and two independent decoders must be implemented when the horizontal code and the vertical code of the product code are different.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a method and device for decoding a product code by using soft decision information.

An exemplary embodiment of the present invention provides a method for a decoding device to decode a codeword matrix of a product code including: generating a first extended parity check matrix for a vertical code; decoding a horizontal codeword of a plurality of rows in the codeword matrix to thus perform a first decoding process; generating a second extended parity check matrix by removing a column corresponding to a row of the first decoding-succeeded horizontal codeword from the first extended parity check matrix; and decoding the first decoding-failed horizontal codeword by using the second extended parity check matrix to thus perform a second decoding process.

Another embodiment of the present invention provides a method for a decoding device to decode a codeword matrix of a product code including: decoding a horizontal codeword of a plurality of rows in the codeword matrix; and when there are at least two decoding-failed horizontal codewords in the codeword matrix, dividing the at least two horizontal codewords into two groups, and re-decoding a first horizontal codeword by using two pieces of independent soft decision information for a virtual first horizontal codeword corresponding to a binary sum of a horizontal codeword in the first group.

Yet another embodiment of the present invention provides a device for decoding a codeword matrix of a product code, including: a horizontal codeword decoder for decoding a horizontal codeword of a plurality of rows in the codeword matrix to thus perform a first decoding process, and decoding a decoding-failed horizontal codeword or virtual horizontal codeword by using a result of combining two pieces of independent soft decision information for the decoding-failed horizontal codeword during the first decoding process or virtual horizontal codeword generated by performing a binary sum on a plurality of decoding-failed horizontal codewords to thus perform a second decoding process; and a soft decision information combiner for combining two pieces of independent soft decision information for the decoding-failed horizontal codeword or the virtual horizontal codeword and providing a combined result to the horizontal codeword decoder.

DETAILED DESCRIPTION OF THE EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout the specification, unless explicitly described to the contrary, the word "comprise" and variations such as "comprises" or "comprising" will be understood to imply the inclusion of stated elements but not the exclusion of any other elements.

Figure 1:
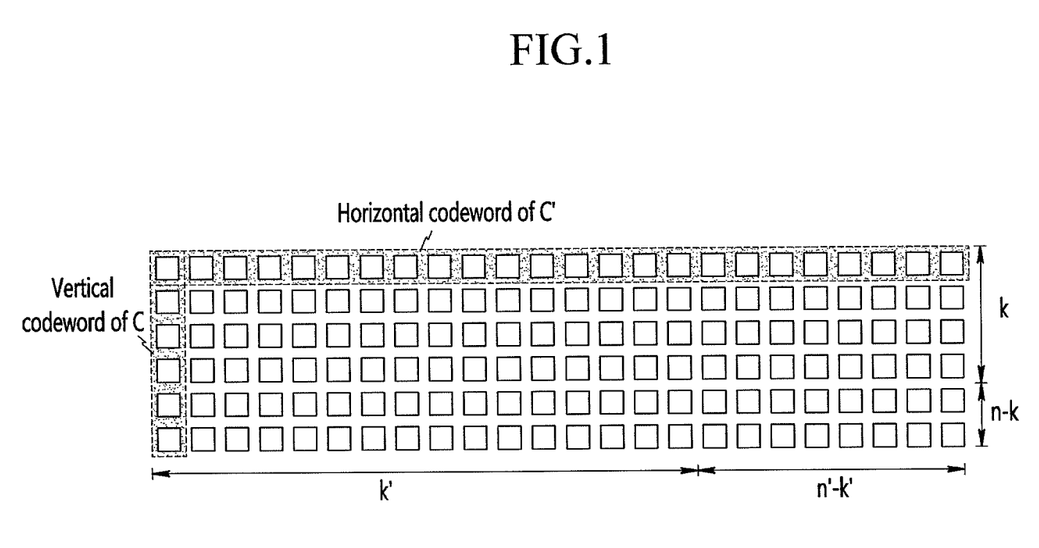
FIG. 1 shows a configuration of a codeword matrix of a product code according to an exemplary embodiment of the present invention.

FIG. 1 shows a configuration of a codeword matrix of a product code according to an exemplary embodiment of the present invention.

Referring to FIG. 1, a product code can be expressed as Equation 1.

$$\mathcal{P} = \mathcal{C} \otimes \mathcal{C}'$$ (Equation 1)

Here, $\mathcal{C}$ is a vertical code and has a parameter of (n, k, $d_{min}$), and $\mathcal{C}'$ is a horizontal code and has a parameter of (n', k', $d'_{min}$). n and n' mean code lengths, k and k' represent information bit lengths, and $d_{min}$ and $d_{min}'$ signify minimum Hamming distances. The horizontal code $\mathcal{C}'$ is a linear code available for detecting decoding errors, and for example, it can be a convolutional code, an LDPC code, or a turbo code. The vertical code $\mathcal{C}$ can be a single parity check code, a Hamming code, or a BCH code.

A codeword matrix of the product code $\mathcal{P}$ arranges k×k' information bits on the k-th row and the k'-th column, encodes the k rows by using the horizontal code $\mathcal{C}'$, and encodes n' columns by using the vertical code $\mathcal{C}$. In the codeword matrix of the product code $\mathcal{P}$, the (n'-k') columns are codewords of the vertical code $\mathcal{C}$, and the (n-k) rows are codewords of the horizontal code $\mathcal{C}'$. Therefore, the entire columns of the codeword matrix of the product code $\mathcal{P}$ are codewords of the vertical code $\mathcal{C}$ and the entire rows are codewords of the horizontal code $\mathcal{C}'$. Here, the entire horizontal codewords are defined to be $c_1, c_2, \ldots, c_n$.

Particularly, when the vertical code $\mathcal{C}'$ is a systematic code, n horizontal codewords of the product code $\mathcal{P}$ can be classified as k systematic horizontal codewords defined as $s_1, s_2, \ldots, s_k$ and (n-k) parity horizontal codewords defined as $p_1, p_2, \ldots, p_{n-k}$. When the vertical code $\mathcal{C}$ is a systematic code and k systematic horizontal codewords are successfully decoded, the entire message information in the corresponding codeword matrix is successfully acquired, and when the vertical code $\mathcal{C}'$ is not a systematic code and n horizontal codewords are successfully decoded, the entire message information in the corresponding codeword matrix is successfully acquired.

We can build a long block code with large minimum Hamming distance by combining short codes with small minimum Hamming distance. It is clear that all the rows of codeword matrix in P are codewords in $\mathcal{C}'$ and all the columns of codeword matrix in P are codewords in $\mathcal{C}$. Even though systematic horizontal codes are used to construct a product code, they do not have to be systematic for our new decoding scheme. Instead, two requirements for the horizontal codes are linearity and decoding-error detection capability. For the vertical codes, they are assumed to be linear in this invention. Product codes can be decoded by sequentially decoding the rows and columns of codeword matrix in order to reduce the decoding complexity. However, for the optimal decoding performance, the maximum likelihood (ML) decoding for the horizontal and vertical codes must be performed, which should be soft decision decoding. Thus, soft-input/soft-output decoders are needed to decode the rows and columns of codeword matrix in P.

However, the ML decoding of the product codes is too complicated for practical use. Moreover, it requires two decoders if the vertical code is different from the horizontal code, which increases the hardware complexity. In this invention, we will consider the product codes with simple vertical codes and propose a feasible decoding scheme based on combining two independently received soft decision data for an unsuccessfully decoded horizontal codeword, which achieves very good decoding performance with low decoding complexity. Also, we define and analyze the decoding capability of the proposed decoding scheme using parity-check matrices of vertical codes and derive the combined-decodability for single parity-check (SPC) and Hamming codes as vertical codes. The proposed scheme shows better error correcting capability in high signal to noise ratio (SNR) region. Although only punctured LDPC codes and simple algebraic codes are used as horizontal and vertical codes in this invention, the application of the proposed decoding scheme to other linear codes is straightforward.

A method for decoding a codeword matrix of a product code according to an exemplary embodiment of the present invention will now be described.

First, the decoding device performs a prearranged process for decoding the product code. That is, a first extended parity check matrix H' is generated from a parity check matrix H of the vertical code. The first extended parity check matrix H' has the entire linear combinations of the respective rows of the parity check matrix H as rows. For example, the parity check matrix H is assumed to have the size of m×n. In this instance, the length n of the vertical code of the parity check matrix H corresponds to a number of horizontal codewords in the codeword matrix of the product code. Since the first extended parity check matrix H' has the entire available linear combinations of the respective rows of the parity check matrix H as rows, the size of the first extended parity check matrix H' is m×n and M=$2^m$−1.

Figure 2A:
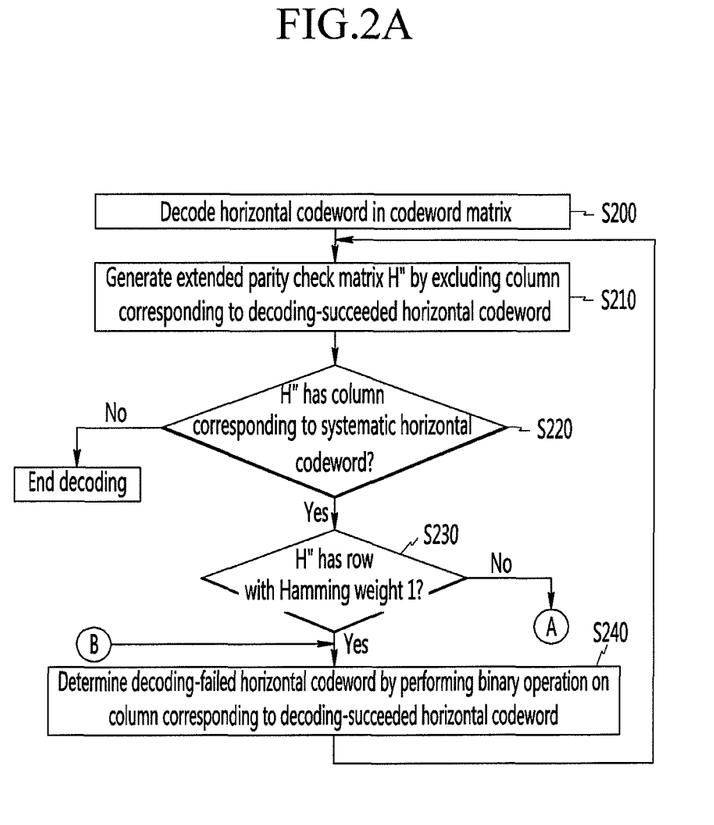
FIG. 2A and FIG. 2B show a flowchart of a method for a decoding device according to an exemplary embodiment of the present invention to decode a product code.
Figure 2B:
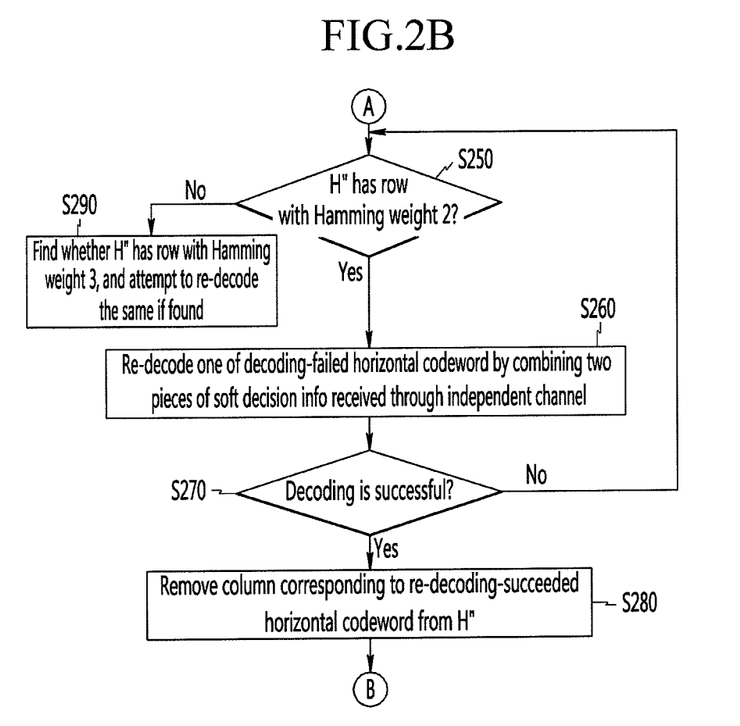

FIG. 2A and FIG. 2B show a flowchart of a method for a decoding device according to an exemplary embodiment of the present invention to decode a product code. It is assumed from the parity check matrix H of the vertical code that the prearranged process for generating the first extended parity check matrix H' is performed in advance.

Referring to FIG. 2A and FIG. 2B, the decoding device decodes each horizontal codeword in the codeword matrix (S200), finds row indices of the codeword matrix of the entire successfully-decoded horizontal codeword, and excludes the columns that have the same value as column indices from the first extended parity check matrix H' to generate a second extended parity check matrix H" (S210). When the size of the first extended parity check matrix H' is M×n and the number of decoding-failed horizontal codewords is e, the second extended parity check matrix H" has the size of M×e.

The decoding device determines whether the second extended parity check matrix H" has a column corresponding to the decoding-failed horizontal codeword, that is, e>0 (S220). When the vertical code is a systematic code, no column corresponds to the systematic horizontal codeword of the codeword matrix, and when the column corresponding to the parity horizontal codeword remains, it means that the entire systematic horizontal codeword of the codeword matrix is successfully decoded. When the vertical code is not a systematic code and no decoding-failed horizontal code remains, it means that the entire horizontal codeword of the codeword matrix is successfully decoded. Therefore, the decoding is finished.

When the corresponding column remains in the horizontal codeword of the codeword matrix, the decoding device determines whether the second extended parity check matrix H" includes the row with a Hamming weight of 1 (S230). The Hamming weight of a specific row signifies the number of elements that are not 0 in the corresponding row, and a row with the Hamming weight of 1 of the second extended parity check matrix H" means that the corresponding check equation has one unknown quantity. When the Hamming weight of the row having the minimum Hamming weight that is not 0 in the second extended parity check matrix H" is defined to be $e_{min}$, it means to find the row with $e_{min}=1$.

When the second extended parity check matrix H" includes the row with the Hamming weight of 1, the decoding device determines the decoding-failed horizontal codeword by performing a binary XOR operation (⊕) on the other decoding-succeeded horizontal codeword (S240). For example, assuming that the index of the row with the Hamming weight 1 in the second extended parity check matrix H" is defined to be j, a set of the elements that are not 0 in the jth row in the first extended parity check matrix H' is defined to be H'(j), and the index of the decoding-failed horizontal codeword is k, where k is the element of H'(j). In this instance, the decoding device can find the decoding-failed horizontal codeword $c_k$ by performing a binary XOR operation on the hard decision values of the horizontal codeword of the indices excluding the index k from H'(j), as expressed in Equation 2.

$$c_k = \bigoplus_{l \in H'(j)\setminus\{k\}} c_l \quad \text{(Equation 2)}$$

The decoding device removes the column (e.g., k-th column) corresponding to the horizontal codeword determined in S240 from the second extended parity check matrix H", and repeats S210 to S240 until the second extended parity check matrix H" no longer has a column corresponding to the horizontal codeword (i.e., e=0).

The decoding device determines whether the row with the Hamming weight 2 exists (S250) when the second extended parity check matrix H" has no Hamming weight 1 in S230. A row with the Hamming weight 2 of the second extended parity check matrix H" signifies that the corresponding check equation has two unknown quantities. That is, it is determined whether there is a row that satisfies $e_{min}=2$.

When the row with the Hamming weight 2 exists, the decoding device combines two pieces of soft decision information received through an independent channel to re-decode one of the decoding-failed horizontal codewords (S260). Here, one of the two pieces of soft decision information is soft decision information of the decoding-failed horizontal codeword, and the other is a value that is extracted by combining hard decision information of the decoding-succeeded horizontal codeword and soft decision information of the decoding-failed horizontal codeword. The soft decision information can be a log-likelihood ratio (LLR). As the LLR value approaches +∞, the probability that the horizontal codeword is 0 becomes greater, and as it approaches −∞, the probability that the horizontal codeword is 1 becomes greater. Therefore, a further reliable decoding result is acquired by adding two pieces of soft decision information for one horizontal codeword and decoding the same.

Assuming that the LLR is used for soft decision information, an operation ⊞ for combining the soft decision information can be defined as follows. When the horizontal codeword is defined to be $c_i=(c_{i1}, c_{i2}, \ldots, c_{in'})$, $1 \leq i \leq n$ and the LLR of each binary value $c_{ij}$ is set to be $r_{ij}$, soft decision information on $c_i$ can be defined to be $r_i=(r_{i1}, r_{i2}, \ldots, r_{in'})$, $1 \leq i \leq n$. If the vertical code is a systematic code, we can use $s_i=(s_{i1}, s_{i2}, \ldots, s_{in'})$, $1 \leq i \leq k$ and $p_i=(p_{i1}, p_{i2}, \ldots, p_{in'})$, $1 \leq i \leq n-k$, to denote the systematic (horizontal) codewords and the parity (horizontal) codewords which are defined as the horizontal codewords in the systematic and the parity parts in a codeword matrix as in FIG. 1, respectively.

Then, the j-th element of $r_i \boxplus r_{i'}$ for the operation ⊞ is defined as Equation 3.

$$2\tanh^{-1}\left(\tanh\left(\frac{r_{ij}}{2}\right)\tanh\left(\frac{r_{i'j}}{2}\right)\right) \quad \text{(Equation 3)}$$

Also, $\bar{r}_i=(\bar{r}_{i1}, \bar{r}_{i2}, \ldots, \bar{r}_{in'})$, $1 \leq i \leq n$ can be defined from the binary value of $c_i$, and it is defined such that $\bar{r}_{ij}=+\infty$ if $c_{ij}=0$, and $\bar{r}_{ij}=-\infty$ if $c_{ij}=1$. Then, the j-th element of $r_i \boxplus \bar{r}_{i'}$ or the j-th element of $\bar{r}_i \boxplus \bar{r}_{i'}$ for the operation ⊞ is extended and defined like Equation 4.

$$\begin{cases} r_{ij}(\text{or } \bar{r}_{ij}) & \text{if } \bar{r}_{i'j} = +\infty \\ -r_{ij}(\text{or } -\bar{r}_{ij}) & \text{if } \bar{r}_{i'j} = -\infty \end{cases} \quad \text{(Equation 4)}$$

When one of the decoding-failed horizontal codewords is successfully re-decoded (S270), the column corresponding to the re-decoding-succeeded horizontal codeword is eliminated from the second extended parity check matrix H" (S280), and the process after the stage S240 is repeated.

However, when it fails to re-decode one of the decoding-failed horizontal codeword (S270), the process after the stage S250 is repeated.

In addition, when the second extended parity check matrix H" has no row of the Hamming weight 2, it is checked whether the second extended parity check matrix H" has a row with the Hamming weight 3, and when it is found, it is attempted to be re-decoded (S290). A detailed process thereof will be described later with reference to FIG. 4.

Figure 3:
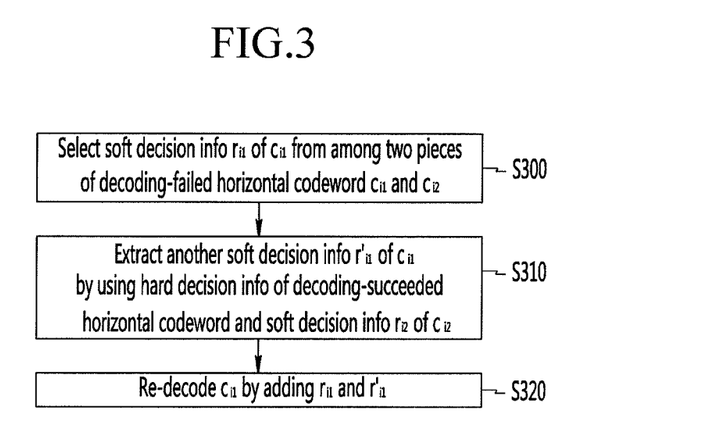
FIG. 3 shows a flowchart of a detailed decoding method when one of check equations of a first extended parity check matrix H' of a vertical code has two decoding-failed horizontal codewords according to an exemplary embodiment of the present invention.

FIG. 3 shows a flowchart of a detailed decoding method when one of check equations of a first extended parity check matrix H' of a vertical code has two decoding-failed horizontal codewords according to an exemplary embodiment of the present invention, that is, when a second extended parity check matrix H" has a row with the Hamming weight 2. It is assumed that the index of the row with the Hamming weight 2 selected from the second extended parity check matrix H" is j, one of the two decoding-failed horizontal codewords is $c_{i_1}$, and the other is $c_{i_2}$. Here, it is given that $i_1, i_2 \in H'(j)$.

Referring to FIG. 3, the decoding device selects soft decision information $r_{i_1}$ of the horizontal codeword $c_{i_1}$ as one piece of soft decision information for the decoding-failed horizontal codeword $c_{i_2}$ (S300). The operation on the soft decision information $r_{i_2}$ is already performed and acquired from channel receiving information.

The decoding device extracts other soft decision information $r_{i_1}'$ on the horizontal codeword $c_{i_1}$ as expressed in Equation 5 (S310) by using hard decision information of the decoding-succeeded horizontal codeword from among the horizontal codeword included in the j-th row of the first extended parity check matrix H' and soft decision information $r_{i_2}$ the decoding-failed horizontal codeword $c_{i_2}$.

$$r_{i_1}' = r_{i_2} \boxplus \left( \boxplus_{\forall l \in H'(j)\setminus\{i_1, i_2\}} \bar{r}_l \right) \quad \text{(Equation 5)}$$

The decoding device re-decodes the horizontal codeword $c_{i_1}$ (S320) by adding two pieces $(r_{i_1}|r_{i_1}')$ of soft decision information $r_{i_1}$ and $r_{i_1}'$ for the horizontal codeword $c_{i_1}$.

Although not shown, when the horizontal codeword $c_{i_1}$ is successfully decoded, the decoding device removes the column corresponding to $c_{i_1}$ from the second extended parity check matrix H", and decodes the decoding-failed horizontal codeword $c_{i_2}$ according to the method of S240 of FIG. 2. However, when it fails to decode the horizontal codeword $c_{i_1}$, a row with another Hamming weight 2 is found from the second extended parity check matrix H" to repeat the process after S300.

Figure 4:
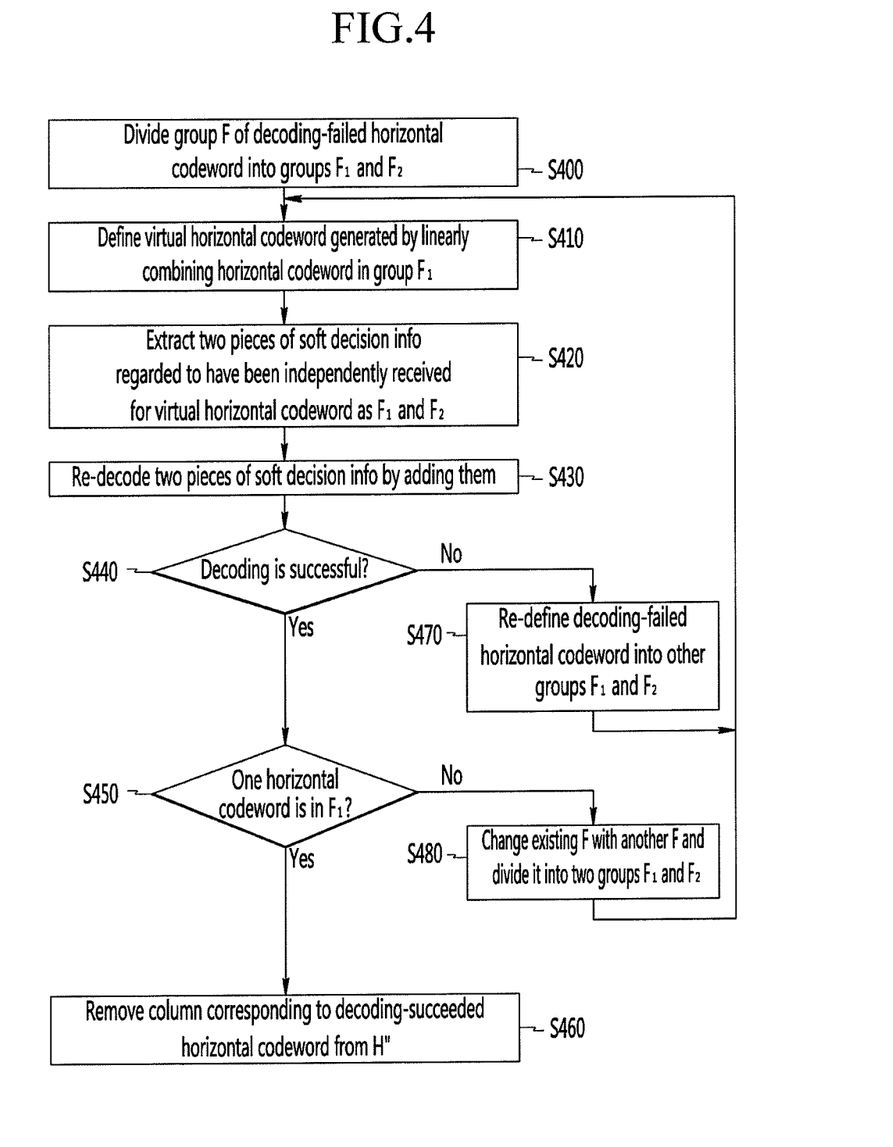
FIG. 4 shows a flowchart of a decoding method when a check equation of a vertical code has at least three decoding-failed horizontal codewords according to an exemplary embodiment of the present invention.

FIG. 4 shows a flowchart of a decoding method when a check equation of a vertical code has at least three decoding-failed horizontal codewords according to an exemplary embodiment of the present invention, that is, when $e_{min} \geq 3$. When the index of the column with the Hamming weight $e_{min}$ in the second extended parity check matrix H" is set to be j, the decoding-failed horizontal codeword in the j column of the index of the first extended parity check matrix H' can be represented as $c_{i_1}, \ldots, c_{i_g}, \ldots, c_{i_h}, \ldots, c_{i_{e\,min}}$. Here, it is given that $i_1, i_2, \ldots, i_{e_{min}} \in H'(j)$.

Referring to FIG. 4, the decoding device divides the decoding-failed horizontal codeword into two groups $F_1$ and $F_2$ (S400), and defines virtual horizontal codeword c' that is generated from a binary XOR operation on the group $F_1$ (S410). Since the horizontal code uses the linear code, the virtual horizontal codeword c' can be expressed as c' in Equation 6. Also, c' satisfies Equation 7 from the j-th check equation of the first extended parity check matrix H'.

$$c' = \bigoplus_{\forall l \in \{i_{h+1}, \ldots, i_{e_{min}}\}} c_l \quad \text{(Equation 6)}$$

$$c' = \bigoplus_{\forall l \in \{i_{h+1}, \ldots, i_{e_{min}}\}} c_l \quad \text{(Equation 7)}$$
$$= \left(\bigoplus_{\forall l \in \{i_1, \ldots, i_h\}} c_l\right) \oplus \left(\bigoplus_{\forall l \in H'(j) \setminus \{i_2, \ldots, i_{e_{min}}\}} c_l\right)$$

Two pieces of soft decision information $r_1'$ and $r_2'$ that can be regarded to have been independently received for the virtual horizontal codeword c' are extracted (S420). In this instance, one piece of soft decision information $r_1'$ can be acquired from Equation 6 by using Equation 8.

$$r_1' = \boxplus_{\forall l \in \{i_{h+1}, \ldots, i_{e_{min}}\}} r_l \quad \text{(Equation 8)}$$

Further, the other piece of soft decision information $r_2'$ is acquirable from Equation 7 by using Equation 9.

$$r_2' = \left(\boxplus_{\forall l \in \{i_1, \ldots, i_h\}} r_l\right) \boxplus \left(\boxplus_{\forall l \in H'(j) \setminus \{i_1, \ldots, i_{e_{min}}\}} r_l\right) \quad \text{(Equation 9)}$$

Next, the decoding device performs re-decoding by using the added value $(r_1'+r_2')$ of $r_1'$ and $r_2'$ that can be regarded as independently received for the virtual horizontal codeword c' (S430).

When the virtual horizontal codeword c' is successfully decoded (S440), $c_{i_1}, \ldots, c_{i_g}, \ldots, c_{i_h}$ are separated into two groups (S480), the virtual horizontal codeword c" is defined like Equation 10, and the virtual horizontal codeword c" is decoded through the process after S410.

$$c'' = \bigoplus_{\forall l \in \{i_{g+1}, \ldots, i_h\}} c_l \quad \text{(Equation 10)}$$
$$= \left(\bigoplus_{\forall l \in \{i_1, \ldots, i_g\}} c_l\right) \oplus \left(\bigoplus_{\forall l \in H'(j) \setminus \{i_1, \ldots, i_h\}} c_l\right)$$

However, when it fails to decode the virtual horizontal codeword c' (S440), the decoding-failed horizontal codeword is divided into two groups (S470), the virtual horizontal codeword c' is re-defined (S410), and the virtual horizontal codeword c' is decoded through the process after $$S420 \cdot c'' = \bigoplus_{\forall l \in \{i_{g+1}, \ldots, i_h\}} c_l$$
$$= \left(\bigoplus_{\forall l \in \{i_1, \ldots, i_g\}} c_l\right) \oplus \left(\bigoplus_{\forall l \in H'(j) \setminus \{i_1, \ldots, i_h\}} c_l\right)$$

By using the method, when the check equation of the vertical code has three or more decoding-failed horizontal codewords, they can be combined and decoded. When a successfully-decoded horizontal codeword is generated by the above-noted recursive decoding process (S450), the column corresponding to the index of the corresponding horizontal codeword is eliminated from H" (S460). When there are at least three decoding-failed horizontal codewords, it is possible to solve them one by one and remove the column from H", and it is also possible to restore any of available horizontal codewords by using usable grouping methods and remove the column from H".

When the single parity check code is used for the vertical code, the case for the decoding device to decode the product code will now be exemplarily described. The horizontal code includes any types of linear codes from which decoding errors may be detected, as well as the LDPC code.

Equation 11 expresses an example of a parity check matrix H of a single parity check code and a first extended parity check matrix H'. The parity check matrix H of the single parity check code, a first extended parity check matrix H', and a second extended parity check matrix H" are always given to be $e=e_{min}$ since they have a row configured with 1's.

$$H=H'=[1\ 1\ \ldots\ 1\ 1] \quad \text{(Equation 11)}$$

The systematic horizontal codeword in the codeword matrix is $s_i(1 \leq i \leq n-1)$ and the parity horizontal codeword is $p_1$, so Equation 12 is satisfied.

$$\left(\bigoplus_{1 \leq i \leq n-1} s_i\right) \oplus p_1 = 0 \quad \text{(Equation 12)}$$

When the decoding device decodes n horizontal codewords in the codeword matrix, it is given that $e=e_{min}=1$, and the decoding-failed horizontal codeword is a parity horizontal codeword $p_1$, decoding is finished since the systematic horizontal codewords of $s_1$ through $s_{n-1}$ are successfully decoded.

When it is given that $e=e_{min}=1$ and the decoding-failed horizontal codeword is a systematic horizontal codeword $s_i$, decoding is successfully finished since $s_i$ corresponds to the sum of decoding-succeeded horizontal codewords according to Equation 13.

$$s_i = \left( \bigoplus_{1 \leq l \leq n-1, l \neq i} s_l \right) \oplus p_1 \quad \text{(Equation 13)}$$

In addition, when it is given that $e=e_{min}-2$ and the decoding-failed horizontal codeword is systematic horizontal codewords $s_{i_1}$ and $s_{i_2}$, Equation 14 can be expressed as follows.

$$s_{i_1} = s_{i_2} \oplus \left( \bigoplus_{1 \leq l \leq n-1, l \neq i_1, l \neq i_2} s_l \right) \oplus p_1 \quad \text{(Equation 14)}$$

Based on Equation 14, new soft decision information $r_{i_1}'$ for the horizontal codeword $s_{i_1}$ can be found by using hard decision information of the decoding-succeeded horizontal codeword and soft decision information of the horizontal codeword $s_{i_2}$. For example, one piece of soft decision information of the horizontal codeword $s_{i_1}$ can be found by using Equation 15.

$$r_{i_1}' = r_{i_2} \boxplus \left( \boxplus_{1 \leq l \leq n, l \neq i_1, l \neq i_2} \bar{r}_l \right) \quad \text{(Equation 15)}$$

$r_{i_1}$ Therefore, the horizontal codeword $s_{i_1}$ can be re-decoded by adding $r_{i_1}$ that is soft decision information received from the original channel of the horizontal codeword $s_{i_1}$ and soft decision information $r_{i_1}'$ that can be considered to have been operated through Equation 15 and independently received, that is, $(r_{i_1} + r_{i_1}')$.

When the horizontal codeword $s_{i_1}$ is successfully decoded, the column of the index $i_1$ is removed from the second extended parity check matrix H" to be $e=e_{min}=1$, and $s_{i_2}$ can be decoded by applying the decoding process for the described case of $e=e_{min}=1$.

When one of the two decoding-failed codewords is a parity horizontal codeword $p_1$, the re-decoding process is performed in a like manner of the above-described method.

When it is given that $e=e_{min}=3$ and the decoding-failed horizontal codeword is systematic horizontal codewords $s_{i_1}$, $s_{i_2}$ and $s_{i_3}$, it can be expressed as Equation 16.

$$s_{i_1} = s_{i_2} \oplus s_{i_3} \oplus \left( \bigoplus_{1 \leq l \leq n-1, l \neq i_1, l \neq i_2, l \neq i_3} s_l \right) \oplus p_1 \quad \text{(Equation 16)}$$

Based on Equation 16, one piece of soft decision information $r_{i_1}'$ of the horizontal codeword $s_{i_1}$ can be found as Equation 17 by using soft decision information of the horizontal codeword $s_{i_2}$, soft decision information of the horizontal codeword $s_{i_3}$, and hard decision information of the decoding-succeeded horizontal codeword.

$$r_{i_1}' = r_{i_2} \boxplus r_{i_3} \boxplus \left( \boxplus_{1 \leq l \leq n, l \neq i_1, l \neq i_2, l \neq i_3} \bar{r}_l \right) \quad \text{(Equation 17)}$$

The soft decision information $r_{i_1}'$ can be added to soft decision information of the horizontal codeword $s_{i_1}$ that is other soft decision information of the horizontal codeword $s_{i_1}$ and can thus be used to decode the horizontal codeword $s_{i_1}$.

When $s_{i_1}$ is successfully decoded, the horizontal codewords $s_{i_2}$ and $s_{i_3}$ can be decoded by using the decoding-succeeded horizontal codeword and the horizontal codeword $s_{i_1}$ in a like manner of the case of $e=e_{min}=2$. When it fails to decode $s_{i_1}$, the left side of Equation 16 is set to be $s_{i_2}$ and two pieces of soft decision information of $s_{i_2}$ are extracted to attempt decoding, and when this process also fails, the same decoding process for $s_{i_3}$ can be performed.

When one of the three decoding-failed codewords is the parity horizontal codeword $p_1$, the re-decoding process is performed in a like manner of the above-described method.

When it is given that $e=e_{min} \geq 4$, the above-described method is applied to perform decoding. However, it is possible to reduce $e_{min}$ by dividing the decoding-failed horizontal codeword into two groups and decoding the virtual codeword corresponding to the binary sum thereof. When the virtual codeword for each group is successfully decoded, it is possible to divide the corresponding groups into two groups and recursively apply the decoding process thereto. In this instance, available grouping methods can be considered until the decoding-failed codeword is successfully decoded.

A method for a decoding device to decode a product code in the case of using a (7,4) Hamming code for the vertical code will now be described. The horizontal code may include linear codes available for detecting decoding errors in addition to the LDPC code.

Equation 18 expresses an example of a parity check matrix H and a first extended parity check matrix H' of the (7,4) Hamming code. In this case, the relationship of $e \geq e_{min}$ is generally satisfied.

$$H = \begin{bmatrix} 1 & 0 & 1 & 1 & 1 & 0 & 0 \\ 1 & 1 & 1 & 0 & 0 & 1 & 0 \\ 0 & 1 & 1 & 1 & 0 & 0 & 1 \end{bmatrix} \Rightarrow H' \quad \text{(Equation 18)}$$

$$= \begin{bmatrix} 1 & 0 & 1 & 1 & 1 & 0 & 0 \\ 1 & 1 & 1 & 0 & 0 & 1 & 0 \\ 0 & 1 & 1 & 1 & 0 & 0 & 1 \\ 0 & 1 & 0 & 1 & 1 & 1 & 0 \\ 1 & 1 & 0 & 0 & 1 & 0 & 1 \\ 1 & 0 & 0 & 1 & 0 & 1 & 1 \\ 0 & 0 & 1 & 0 & 1 & 1 & 1 \end{bmatrix}.$$

When the systematic horizontal codeword in the codeword matrix is set to be $s_i (1 \leq i \leq 4)$ and the parity horizontal codeword is set to be $p_i (1 \leq i \leq 3)$, Equation 19 to Equation 25 are satisfied.

$$s_1 \oplus s_2 \oplus s_4 \oplus p_1 = 0 \quad \text{(Equation 19)}$$

$$s_1 \oplus s_2 \oplus s_3 \oplus p_2 = 0 \quad \text{(Equation 20)}$$

$$s_2 \oplus s_3 \oplus s_4 \oplus p_3 = 0 \quad \text{(Equation 21)}$$

$$s_2 \oplus s_4 \oplus p_1 \oplus p_2 = 0 \quad \text{(Equation 22)}$$

$$s_1 \oplus s_2 \oplus p_1 \oplus p_3 = 0 \quad \text{(Equation 23)}$$

$$s_1 \oplus s_4 \oplus p_2 \oplus p_3 = 0 \quad \text{(Equation 24)}$$

$$s_3 \oplus p_1 \oplus p_2 \oplus p_3 = 0 \quad \text{(Equation 25)}$$

When the decoding device attempts to decode 7 horizontal codewords in the codeword matrix, and when it is given that $e=1$, it is always satisfied that $e_{min}=1$, and for example, when the decoding-failed horizontal codeword is systematic horizontal codeword $s_2$, $s_2$ can be decoded by the binary XOR operation by using one of Equation 20 to Equation 23.

When it is given that $e=2$, it is always satisfied that $e_{min}=1$ so the same can be decoded in a like manner of the above-noted method.

When it is given that e=3, for example, the decoding-failed horizontal codeword is systematic horizontal codewords $s_1$, $s_2$ and $s_3$, it corresponds to the case of $e_{min}=1$, so it can be re-decoded by Equation 22, Equation 24, and Equation 25.

Further, when it is given that e=3 in a like manner, for example, when the decoding-failed horizontal codeword is systematic horizontal codewords $s_1$, $s_2$ and $s_4$, there is no row with the Hamming weight 1 in the second extended parity check matrix H" including the first, second, and fourth columns of the first extended parity check matrix H'. This corresponds to the case of $e_{min}=2$. Therefore, the decoding device extracts one piece of soft decision information for the horizontal codeword $s_1$ by using hard decision information of the decoding-succeeded horizontal codeword $s_3$ and $p_1$ in Equation 19 and soft decision information of the decoding-failed horizontal codeword $s_4$, and adds the extracted soft decision information and soft decision information of the horizontal codeword $s_1$ to attempt to decode the horizontal codeword $s_1$. When the horizontal codeword $s_1$ is successfully decoded, the horizontal codeword $s_4$ can be decoded by using Equation 19. When the horizontal codewords $s_1$ and $s_4$ are decoded, the horizontal codeword $s_2$ can be decoded by using other equations.

The row satisfying $e_{min}=1$ is decoded for the greater e, and the row for $e_{min}=2$ is then decoded. In the case of $e_{min} \geq 3$, it is possible to reduce $e_{min}$ by dividing the decoding-failed horizontal codeword into two groups and decoding the virtual codeword corresponding to the binary sum thereof. When the virtual codeword for each group is successfully decoded, it is possible to divide the corresponding groups into two groups and recursively apply the decoding process thereto, and the decoding process is applicable each time the case in which $e_{min}$ is 1 or 2 is generated. In this instance, available grouping methods can be considered until the decoding-failed codeword is successfully decoded.

For example, there is only one successfully decoded horizontal codeword in a codeword matrix (e=6), say $s_3$. Using equation 19, we have the following decoding steps:
1) Combine the soft decision vectors of $s_4$ and $p_1$ to have the soft decision vector for $s_1 \oplus p_1$;
2) Modify the signs in resulting soft decision vector using $s_3$ to have the soft decision vector for $s_3 \oplus s_4 \oplus p_1$.

The resulting soft decision vector for $s_3 \oplus s_4 \oplus p_1$ can be considered as another independently received vector for $s_1$. Thus this newly created soft decision vector can be added to the original soft decision vector for s 1 and the decoding can be performed for the combined soft decision vector. If the decoding is successful, then it becomes e=5 case. If the decoding is not successful, we can also try the other check equations until the decoding is successful or there are no remaining check equation available.

Figure 5:
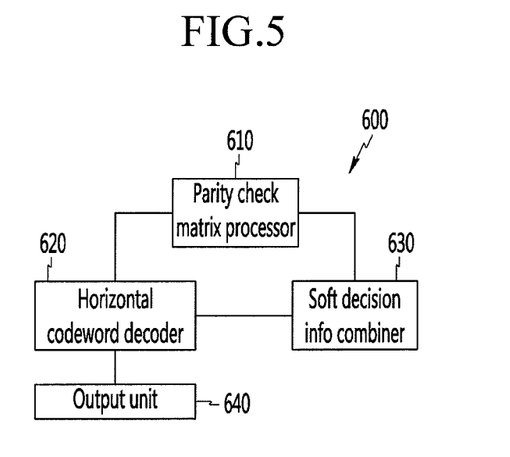
FIG. 5 shows a block diagram of a decoding device according to an exemplary embodiment of the present invention.

FIG. 5 shows a block diagram of a decoding device according to an exemplary embodiment of the present invention.

Referring to FIG. 5, the decoding device 600 includes a parity check matrix processor 610, a horizontal codeword decoder 620, a soft decision information combiner 630, and an output unit 640.

The parity check matrix processor 610 generates a first extended parity check matrix H' for the vertical code from the parity check matrix H, and removes the column corresponding to the row of the decoding-succeeded horizontal codeword from the first extended parity check matrix H' to generate a second extended parity check matrix H". Also, when a decoding-succeeded horizontal codeword is additionally generated during re-decoding, the column corresponding to the index is removed from the second extended parity check matrix H". When a request is generated, information on the parity check matrix H and the first and second extended parity check matrices H', H" is sent to the horizontal codeword decoder 620 and the soft decision information combiner 630.

The horizontal codeword decoder 620 decodes horizontal codewords of a plurality of rows in the codeword matrix, and receives a result of combining two pieces of independent soft decision information for the decoding-failed horizontal codeword or virtual horizontal codeword generated by performing a binary addition on a plurality of decoding-failed horizontal codewords from the soft decision information combiner 630 to re-decode the decoding-failed horizontal codeword.

The soft decision information combiner 630 combines two pieces of soft decision information that are independently received for the decoding-failed horizontal codeword, and provides the combined result to the horizontal codeword decoder 620.

The output unit 640 outputs a decoding result caused by the horizontal codeword decoder 620.

To discuss the combined-decodability of the proposed decoding scheme, the relation between the combined-decodability by the proposed decoding scheme and the vertical code with parity-check matrix H is investigated by using the following two definitions. The soft information combining of the proposed decoding scheme can be applied for any value of $e_{min}$. The analysis of combined-decodability is performed with considering only the case of $e_{min} \leq 2$ in this invention.

Definition 1 ($\epsilon$ combinable): For a given H of a vertical code C and fixed $\epsilon$, if every possible M×$\epsilon$ matrix H" contains at least one row with Hamming weight one or two, C is said to be $\epsilon$ combinable.

Definition 2 ($\eta$ combined-decodable): If a vertical code C is $\epsilon$ combinable for all $\epsilon \leq \eta$, then C is said to be $\eta$ combined-decodable. If C is not ($\eta$+1) combined-decodable but $\eta$ combined-decodable, then $\eta$ is called the combined-decodability of C.

Using the above definitions, the code length can be bounded as in the following lemmas and theorems.

Lemma 3: If a vertical code C with parity-check matrix H is $\epsilon$ combinable, any code $\tilde{c}$ whose parity-check matrix $\tilde{H}$ is constructed by selecting $\epsilon$ or more columns from H is also $\epsilon$ combinable.

Proof: A set of all possible $\tilde{H}$"s which are constructed by selecting $\epsilon$ columns from $\tilde{H}'$ is a subset of the set of all possible H"s which are constructed by selecting $\epsilon$ columns from H'.

Lemma 4: All vertical codes's are 1 and 2 combinable.

Proof: Since there is no all-zero column in the parity-check matrix H of any code C, all C's are both 1 and 2 combinable.

Lemma 5: If a code C with an m×n parity-check matrix H is 3 combinable, then $n \leq 2M$, where $M=2^m-1$. Moreover, C with an m×n H of n=2M is 3 combinable if and only if H is constructed by using every non-zero m-tuple column vector exactly twice as its columns.

Proof: If H has $n \geq 2M+1$, then there should exist three identical columns in H'. If three identical columns are selected to construct H", each row weight of H" is zero or three. Thus C cannot be 3 combinable.

(Only if part) For a parity-check matrix H with n=2M of a 3 combinable code C, suppose that all the non-zero m-tuple column vectors do not appear exactly twice in H. Then H' should have at least three identical columns. If those three identical columns are selected to construct H", it contradicts the assumption that C is 3 combinable.

(If part) n=2M because the number of non-zero m-tuple column vectors is $M=2^m-1$. If we construct H" by choosing any three columns from H', there should be at least one distinct column from the others and we can always find a row of weight one or two in H".

From Lemmas 4 and 5, the following theorem can be stated without proof.

Theorem 6: The combined-decodability of SPC codes is two.

In order to find the combined-decodability of Hamming codes, the following lemmas are needed.

Lemma 7: If a code C with an m×n parity-check matrix H is 4 combinable, then n≧3M, where $M=2^m-1$. Moreover, C with an m×n H of n=3M is 4 combinable if and only if H is constructed by using every non-zero m-tuple column vector exactly three times as its columns.

Proof: If H has n≧3M+1, then there should exist four identical columns in H'. If four identical columns are selected to construct H", each row weight of H" is zero or four. Thus C cannot be 4 combinable.

(Only if part) Suppose that there is neither a weight-1 row nor a weight-2 row in H" for ϵ=4. Since both H' and H" are closed under the row-wise addition, H" can be of two distinct forms, that is, one has only [1 1 1 1] as its nonzero rows and the other has only one 4-tuple of weight three, say [1 1 1 0], as its nonzero rows, that is, $$H'' = \begin{bmatrix} 0 & 0 & 0 & 0 \\ \vdots & \vdots & \vdots & \vdots \\ 0 & 0 & 0 & 0 \\ 1 & 1 & 1 & 1 \\ \vdots & \vdots & \vdots & \vdots \\ 1 & 1 & 1 & 1 \end{bmatrix} \text{ or } \begin{bmatrix} 0 & 0 & 0 & 0 \\ \vdots & \vdots & \vdots & \vdots \\ 0 & 0 & 0 & 0 \\ 1 & 1 & 1 & 0 \\ \vdots & \vdots & \vdots & \vdots \\ 1 & 1 & 1 & 0 \end{bmatrix}$$

The latter matrix cannot exist because there cannot be all-zero column in H". Therefore the former matrix is the only possible matrix for H" having rows of weight zero or four.

For a parity-check matrix H with n=3M of a 4 combinable code C, suppose that H contains at least one type of non-zero m-tuple column vector whose number of occurrence is not three. Then H and H' should have at least four identical columns. If those four identical columns are selected to construct H", then there is no row of weight one or two in H". Thus it contradicts the assumption that C is 4 combinable.

(If part) Since each nonzero m-tuple column vector appears exactly three times, n=3M. If we choose any four columns from H', there should be at least one distinct column from the others and thus there should be a row of weight one or two in H".

The following corollary is given without proof.

Corollary 8: If a code C is 3 combinable, then C is also 4 combinable and thus the C is 4 combined-decodable.

Lemma 9: If a code C with an m×n parity-check matrix H is 5 combinable, then n≦M+3, where $M=2^m-1$. Moreover, C with an m×n H of n=M+3 is 5 combinable if and only if H is constructed by using every non-zero m-tuple column vector such that one of them is used four times and the others are used only once as its columns.

Proof: Suppose that there is neither a weight-1 row nor a weight-2 row in H" for ϵ=5. Since both H' and H" are closed under the row-wise addition, there are only two kinds of H" as 1) nonzero rows in H" should be [1 1 1 1 1];
2) nonzero rows in H" should be [1 1 1 1 0], [0 0 1 1 1], and [1 1 0 0 1].

Note that the second case represents all the cases of three non-zero rows having 1, 2, and 2 zeros in different positions, respectively. Then we have $$H'' = \begin{bmatrix} 0 & 0 & 0 & 0 & 0 \\ \vdots & \vdots & \vdots & \vdots & \vdots \\ 0 & 0 & 0 & 0 & 0 \\ \vdots & \vdots & \vdots & \vdots & \vdots \\ 0 & 0 & 0 & 0 & 0 \\ 1 & 1 & 1 & 1 & 1 \\ \vdots & \vdots & \vdots & \vdots & \vdots \\ \vdots & \vdots & \vdots & \vdots & \vdots \\ 1 & 1 & 1 & 1 & 1 \end{bmatrix} \text{ or } \begin{bmatrix} 0 & 0 & 0 & 0 & 0 \\ \vdots & \vdots & \vdots & \vdots & \vdots \\ 0 & 0 & 0 & 0 & 0 \\ 1 & 1 & 1 & 1 & 0 \\ \vdots & \vdots & \vdots & \vdots & \vdots \\ 1 & 1 & 1 & 1 & 0 \\ 0 & 0 & 1 & 1 & 1 \\ \vdots & \vdots & \vdots & \vdots & \vdots \\ 0 & 0 & 1 & 1 & 1 \\ 1 & 1 & 0 & 0 & 1 \\ \vdots & \vdots & \vdots & \vdots & \vdots \\ 1 & 1 & 0 & 0 & 1 \end{bmatrix}.$$

Therefore, in order for C to be 5 combinable, H should contain neither five identical columns nor two pairs of the same columns. Therefore n≦M+3.

(Only if part) Suppose that a code C with an m×(M+3) H is 5 combinable. Then, from the above argument, C should contain neither five identical columns nor two pairs of the same columns. Therefore, the proof is clear.

(If part) Since one non-zero column of H appears four times and the remaining M−1 non-zero columns are all distinct. It is clear that H" cannot be any of the above two matrices. Therefore, this C 5 combinable.

Lemma 10: Hamming codes are neither 6 combinable nor 7 combinable.

Proof: For a (7,4) Hamming code, H' is given as $$H' = \begin{bmatrix} 1 & 0 & 1 & 1 & 1 & 0 & 0 \\ 0 & 1 & 0 & 1 & 1 & 1 & 0 \\ 0 & 0 & 1 & 0 & 1 & 1 & 1 \\ 1 & 0 & 0 & 1 & 0 & 1 & 1 \\ 1 & 1 & 0 & 0 & 1 & 0 & 1 \\ 1 & 1 & 1 & 0 & 0 & 1 & 0 \\ 0 & 1 & 1 & 1 & 0 & 0 & 1 \end{bmatrix}.$$

The first three rows in H' show all possible length-3 non-zero column vectors and the rows in H' are all possible linear combinations of the first three rows except all-zero row. If ϵ=7, clearly all rows in H" have weight four. Therefore, a (7,4) Hamming code is not 7 combinable.

For a $(2^m-1, 2^m-m-1)$ Hamming code, there are all m-tuple column vectors except all-zero column vector in H. Using only column permutation, we can rewrite H as $$H = \begin{bmatrix} 0 & 0 & 0 & 0 & 0 & 0 & 0 & \ldots \\ \vdots & \vdots & \vdots & \vdots & \vdots & \vdots & \vdots & \ldots \\ 0 & 0 & 0 & 0 & 0 & 0 & 0 & \ldots \\ 1 & 0 & 1 & 1 & 1 & 0 & 0 & \ldots \\ 0 & 1 & 0 & 1 & 1 & 1 & 0 & \ldots \\ 0 & 0 & 1 & 0 & 1 & 1 & 1 & \ldots \end{bmatrix}$$

where the first seven column vectors have zeros in the first m−3 positions and they are all different from each other. Since there is no all-zero column vector in H, there exist all nonzero 3-tuple column vectors in the last three rows of the first seven columns. Then, we can construct H' by all possible non-zero linear combination of rows in H and H" by selecting the first seven columns from H' as $$H' = \begin{bmatrix} 0 & 0 & 0 & 0 & 0 & 0 & 0 & \dots \\ \vdots & \vdots & \vdots & \vdots & \vdots & \vdots & \vdots & \dots \\ 0 & 0 & 0 & 0 & 0 & 0 & 0 & \dots \\ 1 & 0 & 1 & 1 & 1 & 0 & 0 & \dots \\ \vdots & \vdots & \vdots & \vdots & \vdots & \vdots & \vdots & \dots \\ 1 & 0 & 1 & 1 & 1 & 0 & 0 & \dots \\ 0 & 1 & 0 & 1 & 1 & 1 & 0 & \dots \\ \vdots & \vdots & \vdots & \vdots & \vdots & \vdots & \vdots & \dots \\ 0 & 1 & 0 & 1 & 1 & 1 & 0 & \dots \\ 0 & 0 & 1 & 0 & 1 & 1 & 1 & \dots \\ \vdots & \vdots & \vdots & \vdots & \vdots & \vdots & \vdots & \dots \\ 0 & 0 & 1 & 0 & 1 & 1 & 1 & \dots \\ 1 & 0 & 0 & 1 & 0 & 1 & 1 & \dots \\ \vdots & \vdots & \vdots & \vdots & \vdots & \vdots & \vdots & \dots \\ 1 & 0 & 0 & 1 & 0 & 1 & 1 & \dots \\ 1 & 1 & 0 & 0 & 1 & 0 & 1 & \dots \\ \vdots & \vdots & \vdots & \vdots & \vdots & \vdots & \vdots & \dots \\ 1 & 1 & 0 & 0 & 1 & 0 & 1 & \dots \\ 1 & 1 & 1 & 0 & 0 & 1 & 0 & \dots \\ \vdots & \vdots & \vdots & \vdots & \vdots & \vdots & \vdots & \dots \\ 1 & 1 & 1 & 0 & 0 & 1 & 0 & \dots \\ 0 & 1 & 1 & 1 & 0 & 0 & 1 & \dots \\ \vdots & \vdots & \vdots & \vdots & \vdots & \vdots & \vdots & \dots \\ 0 & 1 & 1 & 1 & 0 & 0 & 1 & \dots \end{bmatrix} \Rightarrow H'' = \begin{bmatrix} 0 & 0 & 0 & 0 & 0 & 0 & 0 \\ \vdots & \vdots & \vdots & \vdots & \vdots & \vdots & \vdots \\ 0 & 0 & 0 & 0 & 0 & 0 & 0 \\ 1 & 0 & 1 & 1 & 1 & 0 & 0 \\ \vdots & \vdots & \vdots & \vdots & \vdots & \vdots & \vdots \\ 1 & 0 & 1 & 1 & 1 & 0 & 0 \\ 0 & 1 & 0 & 1 & 1 & 1 & 0 \\ \vdots & \vdots & \vdots & \vdots & \vdots & \vdots & \vdots \\ 0 & 1 & 0 & 1 & 1 & 1 & 0 \\ 0 & 0 & 1 & 0 & 1 & 1 & 1 \\ \vdots & \vdots & \vdots & \vdots & \vdots & \vdots & \vdots \\ 0 & 0 & 1 & 0 & 1 & 1 & 1 \\ 1 & 0 & 0 & 1 & 0 & 1 & 1 \\ \vdots & \vdots & \vdots & \vdots & \vdots & \vdots & \vdots \\ 1 & 0 & 0 & 1 & 0 & 1 & 1 \\ 1 & 1 & 0 & 0 & 1 & 0 & 1 \\ \vdots & \vdots & \vdots & \vdots & \vdots & \vdots & \vdots \\ 1 & 1 & 0 & 0 & 1 & 0 & 1 \\ 1 & 1 & 1 & 0 & 0 & 1 & 0 \\ \vdots & \vdots & \vdots & \vdots & \vdots & \vdots & \vdots \\ 1 & 1 & 1 & 0 & 0 & 1 & 0 \\ 0 & 1 & 1 & 1 & 0 & 0 & 1 \\ \vdots & \vdots & \vdots & \vdots & \vdots & \vdots & \vdots \\ 0 & 1 & 1 & 1 & 0 & 0 & 1 \end{bmatrix}.$$

Types of all possible non-zero rows in H" are addressed in the above and there are seven distinct types. In H", there are only two types of rows, weight zero and four. Therefore, Hamming codes are not 7 combinable. It is easy to check that Hamming codes are not 6 combinable because we can always find an H" for e=6 which consists of weight-0, weight-3, and weight-4 rows from the above H" for e=7.

The following theorem is given without proof.

Theorem 11: The combined-decodability of Hamming codes is five.

TABLE 1

Number of distinct H" for e

| (n, k) | e | Total ($_e^n$) | With rows of Hamming weight one or two | Without rows of Hamming weight one or two |
|---|---|---|---|---|
| (7, 4) | 6 | 7 | 0 | 7 |
|  | 5 | 21 | 21 | 0 |
|  | 4 | 35 | 35 | 0 |
|  | 3 | 35 | 35 | 0 |
|  | 2 | 21 | 21 | 0 |
| (15, 11) | 10 | 3003 | 0 | 3003 |
|  | 9 | 5005 | 396 | 4609 |
|  | 8 | 6435 | 2772 | 3663 |
|  | 7 | 6435 | 5313 | 1122 |
|  | 6 | 5005 | 4900 | 105 |
|  | 5 | 3003 | 3003 | 0 |
|  | 4 | 1365 | 1365 | 0 |
|  | 3 | 455 | 455 | 0 |

TABLE 1-continued

Number of distinct H" for e

| (n, k) | e | Total ($_e^n$) | With rows of Hamming weight one or two | Without rows of Hamming weight one or two |
|---|---|---|---|---|
| (31, 26) | 10 | 44352165 | 20827060 | 23525105 |
|  | 9 | 20160075 | 15860120 | 4299955 |
|  | 8 | 7888725 | 7681550 | 207175 |
|  | 7 | 2629575 | 2597965 | 31610 |
|  | 6 | 736281 | 735196 | 1085 |
|  | 5 | 169911 | 169911 | 0 |
|  | 4 | 31465 | 31465 | 0 |
|  | 3 | 4495 | 4495 | 0 |
| (63, 57) | 7 | 553270671 | 552631671 | 639000 |
|  | 6 | 67945521 | 67935755 | 9766 |
|  | 5 | 7028847 | 7028847 | 0 |
|  | 4 | 595665 | 595665 | 0 |
|  | 3 | 39711 | 39711 | 0 |

TABLE 2

Number of distinct H" for e

| (n, k) | e | Total ($_e^n$) | With rows of Hamming weight one or two | Without rows of Hamming weight one or two |
|---|---|---|---|---|
| (6, 4) | 5 | 6 | 0 | 6 |
|  | 4 | 15 | 15 | 0 |
|  | 3 | 20 | 20 | 0 |
|  | 2 | 15 | 15 | 0 |
| (12, 10) | 7 | 792 | 0 | 792 |
|  | 6 | 924 | 84 | 840 |
|  | 5 | 792 | 360 | 432 |
|  | 4 | 495 | 492 | 3 |
|  | 3 | 220 | 208 | 12 |
|  | 2 | 66 | 66 | 0 |

TABLE 3

| (n, k) | Code | Generator polynomial | $d_{min}$ | $\tau$ correctability | $\eta$ combined-decodability |
|---|---|---|---|---|---|
| (63, 57) | Hamming | $x^6 + x + 1$ | 3 | 2 | 5 |
| (31, 26) |  | $x^5 + x^2 + 1$ |  |  |  |
| (15, 11) |  | $x^4 + x + 1$ |  |  |  |
| (7, 4) |  | $x^3 + x + 1$ |  |  |  |
| (12, 10) | DPC | $x^2 + x + 1$ | 2 | 1 | 2 |
| (6, 4) |  |  |  |  | 4 |
| (k + 1, k) | SPC | x + 1 |  |  | 2 |

Table 1 shows the distributions of H" for all possible unsuccessfully decoded horizontal codewords when Hamming codes are used as vertical codes. It clearly shows that any Hamming code is 5 combined-decodable.

Table 2 shows the distributions of H" for all possible unsuccessfully decoded horizontal codewords when double parity-check (DPC) codes are used as vertical codes. It shows that the combined-decodabilities of (6,4) and (12,10) DPC codes are four and two, respectively.

To analyze the combined-decodability of the proposed decoding scheme, some simple linear codes are used as vertical codes. We consider the SPC code, the DPC code, and Hamming code as vertical codes, the parameters of which are listed in Table 3.

Figure 6:
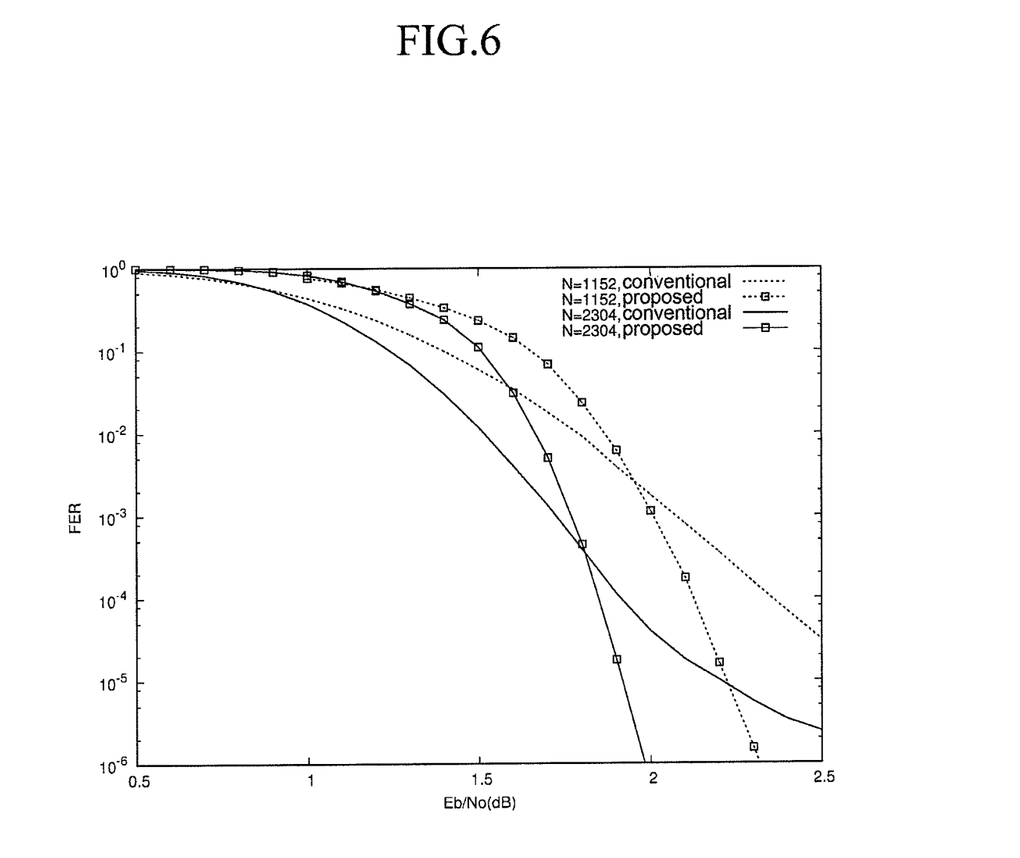
FIG. 6 and FIG. 7 show graphs for indicating effects caused by a decoding method of a decoding device according to an exemplary embodiment of the present invention.
Figure 7:
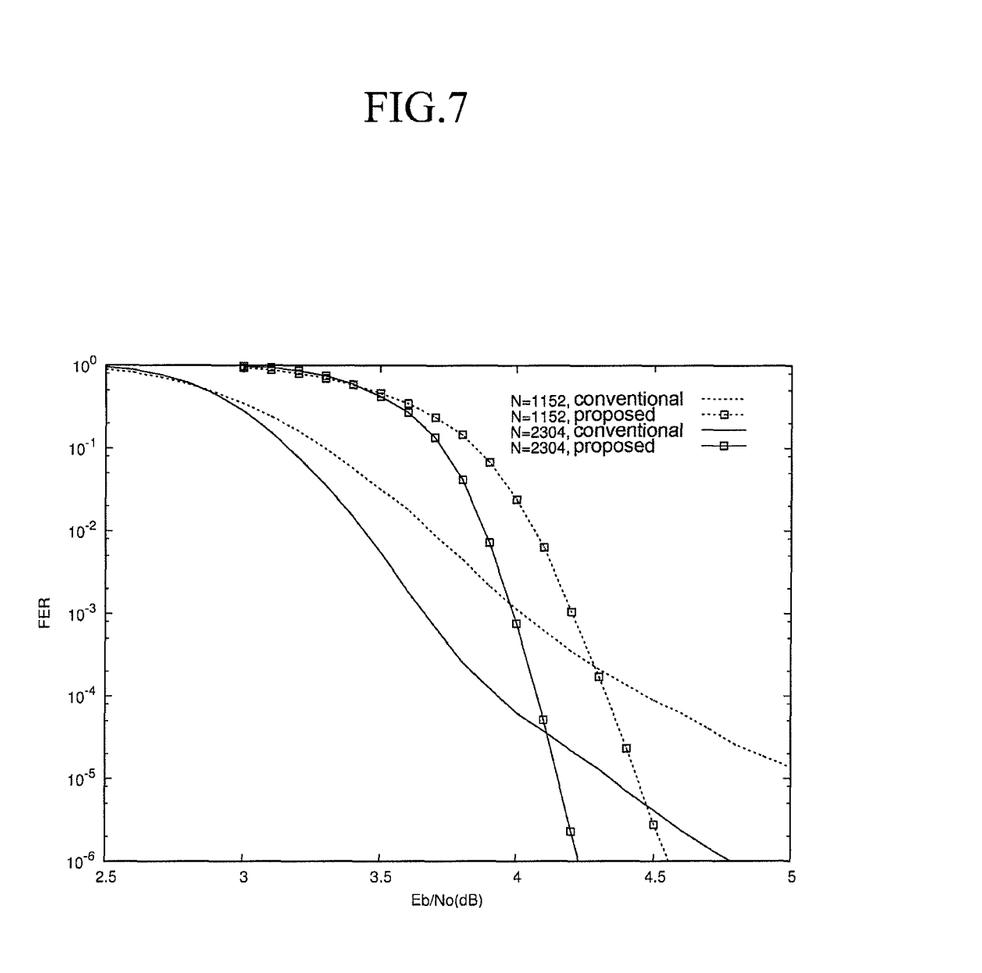

FIG. 6 and FIG. 7 show graphs for indicating effects caused by a decoding method of a decoding device according to an exemplary embodiment of the present invention.

In FIG. 6, the method (i.e., proposed method) according to an exemplary embodiment of the present invention uses the (24,23) single parity check code for the vertical code and the R=12/23 code generated by puncturing the R=1/2 LDPC code of the IEEE 802.16e for the horizontal code, and the conventional method uses the R=1/2 LDPC code of the IEEE 802.16e.

In FIG. 7, the method according to an exemplary embodiment of the present invention uses the (24, 23) single parity check code for the vertical code and the R=20/23 code generated by puncturing the R=5/6 LDPC code of the IEEE 802.16e for the horizontal code, and the conventional method uses the R=5/6 LDPC code of the IEEE 802.16e.

Referring to FIG. 6 and FIG. 7, the method according to the exemplary embodiment of the present invention outperforms the conventional method using the single code. Particularly, the method according to the exemplary embodiment of the present invention generates far better results in the case of high signal to noise ratio (SNR).

According to the embodiments of the present invention, the product code can be decoded by using a single decoder, differing from the conventional method that requires a horizontal codeword decoder and a vertical codeword decoder for decoding a codeword matrix of the product code. Therefore, the complexity of the device can be reduced.

Computational complexity during the process for decoding the codeword matrix of the product code can be reduced, and a decoding result with very low BER is acquirable.

The above-described embodiments can be realized through a program for realizing functions corresponding to the configuration of the embodiments or a recording medium for recording the program in addition to through the above-described device and/or method, which is easily realized by a person skilled in the art.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for a decoding device to decode a codeword matrix of a product code, comprising:
   generating, with a parity check matrix processor, a first extended parity check matrix for a vertical code;
   decoding a horizontal codeword of a plurality of rows in the codeword matrix to thus perform a first decoding process;
   generating a second extended parity check matrix by removing a column corresponding to a row of a first decoding-succeeded horizontal codeword from the first extended parity check matrix; and
   decoding a first decoding-failed horizontal codeword by using the second extended parity check matrix to thus perform a second decoding process.

2. The method of claim 1, wherein
   the first extended parity check matrix has all linear combinations of the rows of a parity check matrix of the vertical code as its rows.

3. The method of claim 1, wherein
   the second decoding process includes:
   finding the first decoding-failed horizontal codeword by performing a binary operation on the first decoding-succeeded horizontal codeword for a row including one first decoding-failed horizontal codeword in a column in the codeword matrix from among rows of the first extended parity check matrix H'.

4. The method of claim 1, wherein
   the second decoding process includes:
   extracting two pieces of independent soft decision information for the first horizontal codeword that is one of the two first decoding-failed horizontal codewords for the row including two first decoding-failed horizontal codewords from among the rows of the first extended parity check matrix H';
   decoding the first horizontal codeword by using an added value of the two pieces of soft decision information; and
   decoding the second horizontal codeword that is the other of the two first decoding-failed horizontal codewords by performing a binary operation on the decoded first horizontal codeword and the first decoding-succeeded horizontal codeword.

5. The method of claim 4, wherein
   one of the two pieces of soft decision information is soft decision information of the first horizontal codeword, and the other thereof is soft decision information extracted by using hard decision information of the first decoding-succeeded horizontal codeword and soft decision information of the second horizontal codeword.

6. The method of claim 5, wherein
   soft decision information of the first horizontal codeword and soft decision information of the second horizontal codeword are calculated by using a log-likelihood ratio (LLR).

7. A method for a decoding device to decode a codeword matrix of a product code, comprising:
   decoding, with a horizontal codeword decoder, a horizontal codeword of a plurality of rows in the codeword matrix; and
   when there are at least two decoding-failed horizontal codewords in the codeword matrix, dividing the at least two horizontal codewords into two groups, and re-decoding the first horizontal codeword by using two pieces of independent soft decision information for a virtual first horizontal codeword corresponding to a binary sum of the horizontal codeword in the first group.

8. The method of claim 7, wherein
   the re-decoding process includes:
   re-decoding the first horizontal codeword by using an added value of the two pieces of soft decision information; and
   re-decoding at least one horizontal codeword except the first horizontal codeword from among the at least two horizontal codewords by using the re-decoded first horizontal codeword.

9. The method of claim 7, wherein
   one of the two pieces of soft decision information is soft decision information of the first horizontal codeword, and
   the other thereof is extracted by using hard decision information of the decoding-succeeded horizontal codeword in the decoding process and soft decision information of the horizontal codeword except the horizontal codeword in the first group from among the at least two horizontal codewords.

10. A device for decoding a codeword matrix of a product code, comprising:
    a horizontal codeword decoder for decoding a horizontal codeword of a plurality of rows in the codeword matrix to thus perform a first decoding process, and decoding a decoding-failed horizontal codeword or virtual horizontal codeword by using a result of combining two pieces of independent soft decision information for the decoding-failed horizontal codeword during the first decoding process or virtual horizontal codeword generated by performing a binary sum on a plurality of decoding-failed horizontal codewords to thus perform a second decoding process; and a soft decision information combiner for combining two pieces of independent soft decision information for the decoding-failed horizontal codeword or the virtual horizontal codeword and providing a combined result to the horizontal codeword decoder.

11. The device of claim 10, wherein when there are at least two decoding-failed horizontal codewords in the codeword matrix, one of the two pieces of soft decision information is soft decision information of a virtual first horizontal codeword corresponding to a binary sum of a horizontal codeword in a first group when the at least two horizontal codewords are divided into two groups, and the other thereof is extracted by using hard decision information of a decoding-succeeded horizontal codeword and soft decision information of the horizontal codeword except the horizontal codeword in the first group from among the at least two horizontal codewords.

12. The device of claim 10, further including a parity check matrix processor for generating a first extended parity check matrix for a vertical code, and generating a second extended parity check matrix by removing a column corresponding to a row of a first decoding-succeeded horizontal codeword from the first extended parity check matrix.

13. The device of claim 10, wherein when a vertical code is a single parity check code, the horizontal codeword decoder calculates and stores a binary XOR accumulated sum on a decoding-succeeded horizontal codeword during the first decoding process, and decodes the decoding-failed horizontal codeword during the first decoding process by using the stored binary XOR accumulated sum to thus perform a second decoding process.

* * * * *